United States Patent [19]
Johnson et al.

[11] Patent Number: 5,494,448
[45] Date of Patent: Feb. 27, 1996

[54] CANTILEVER SPRING AND METHOD FOR TEMPORARILY COUPLING A SEMICONDUCTOR DEVICE TO A TRANSMISSION LINE USING THE CANTILEVER SPRING

[75] Inventors: Derek Johnson, Tempe; Mavin C. Swapp, Gilbert, both of Ariz.

[73] Assignee: Motorola, Inc., Schaumburg, Ill.

[21] Appl. No.: 212,092

[22] Filed: Mar. 15, 1994

[51] Int. Cl.$^6$ .................................................. H01R 9/09
[52] U.S. Cl. ............................................. 439/72; 439/68
[58] Field of Search ................................ 439/70, 71, 72, 439/73, 68

[56] References Cited

U.S. PATENT DOCUMENTS

| | | | |
|---|---|---|---|
| 4,359,252 | 11/1982 | Olsson et al. ........................ | 439/71 OR |
| 4,553,192 | 11/1985 | Babuka et al. ....................... | 439/71 XR |
| 4,688,870 | 8/1987 | Egawa et al. ........................ | 439/70 XR |
| 4,872,850 | 10/1989 | Mogi et al. . | |
| 4,956,604 | 9/1990 | Cedrone . | |
| 5,067,904 | 11/1991 | Takeuchi et al. . | |
| 5,069,629 | 12/1991 | Johnson . | |
| 5,177,436 | 1/1993 | Lee . | |
| 5,252,079 | 10/1993 | Grabbe ................................ | 439/70 OR |

FOREIGN PATENT DOCUMENTS

| | | |
|---|---|---|
| 0458448 | 3/1991 | European Pat. Off. . |
| 2124433 | 2/1984 | United Kingdom ................... 439/71 |

OTHER PUBLICATIONS

Motorola ECLinPS Data Book, 1991, pp. 4–8–4–28.

*Primary Examiner*—Neil Abrams
*Assistant Examiner*—Daniel Wittels
*Attorney, Agent, or Firm*—Rennie William Dover

[57] ABSTRACT

A cantilever spring (16) and a method for temporarily coupling a semiconductor package (36) to a transmission line (14) by means of the cantilever spring (16). The cantilever (16) has first and second pressure points (22, 32) that contact the transmission line (14). A force is applied to a third pressure point (32) which moves the first and second pressure points in opposite directions along the transmission line (14). In addition, the force on the third pressure point moves an end (21) of the cantilever spring (16) in a direction away from the transmission line (14). A lead (37) from the semiconductor package (36) contacts a portion of the end (21). Electrical signals are transmitted between the semiconductor package (36) and a tester via the cantilever spring (16) and the transmission line (14), wherein the electrical signals are for testing a semiconductor device (30).

20 Claims, 5 Drawing Sheets

CANTILEVER SPRING AND METHOD FOR TEMPORARILY COUPLING A SEMICONDUCTOR DEVICE TO A TRANSMISSION LINE USING THE CANTILEVER SPRING

FIELD OF THE INVENTION

The present invention relates, in general, to testing semiconductor devices, and more particularly, to coupling a semiconductor device to a transmission line.

BACKGROUND OF THE INVENTION

Generally, a semiconductor device is packaged and tested before being released as a finished product. An important step in testing the packaged semiconductor device is coupling the leads extending from the packaged semiconductor device to a test fixture. Typically, a socket having a plurality of electrical interconnects is mounted to the test fixture, then the packaged semiconductor device is mounted to the socket such that the leads of the semiconductor device contact the electrical interconnects. Electrical signals are transmitted between the semiconductor device and a tester via the electrical interconnects.

As the speed of the electrical signal traveling along the electrical interconnect increases, i.e., high frequency electrical signals, the electrical interconnect behaves as a transmission line. A drawback of an electrical interconnect in a socket behaving as a transmission line is that the characteristic impedance of the transmission line is uncontrolled. Thus, reflections on the transmission line may occur. In addition, portions of the electrical interconnects may be formed or bent to mate with transmission lines on the test fixture, wherein the bent portions serve as "stubs", further increasing the reflections. The bends forming the stubs as well as any other bends in the electrical interconnects have a high self-inductance which hinders accurate measurement of high frequency characteristics.

Accordingly, it would be advantageous to have an electrical interconnect that provides a controlled impedance environment when coupled with a transmission line of a test fixture. The electrical interconnect should offer minimal "stub" lengths and minimal self-inductance. It would be of further advantage for the electrical interconnect to wipe or scrub the surface of transmission line of the test fixture and the semiconductor device lead.

DETAILED DESCRIPTION OF THE DRAWINGS

Generally, the present invention provides a method for temporarily coupling a semiconductor device to a transmission line for testing the semiconductor device. Coupling of the semiconductor device to the transmission line is accomplished with a cantilever spring having at least two pressure points. The pressure points contact the transmission line and are moved along portions of the transmission line. Moving the pressure points provides a scrubbing or wiping action along the transmission line that ensures a low resistance contact between the cantilever spring and the transmission line. The step of moving the pressure points also moves an end of the cantilever spring in a direction away from the transmission line, which mitigates planarity differences between the leads of the semiconductor device. Further, the present invention provides a controlled impedance environment, i.e., the characteristic impedance of the cantilever spring is substantially equal to that of the transmission line.

Figure 1:
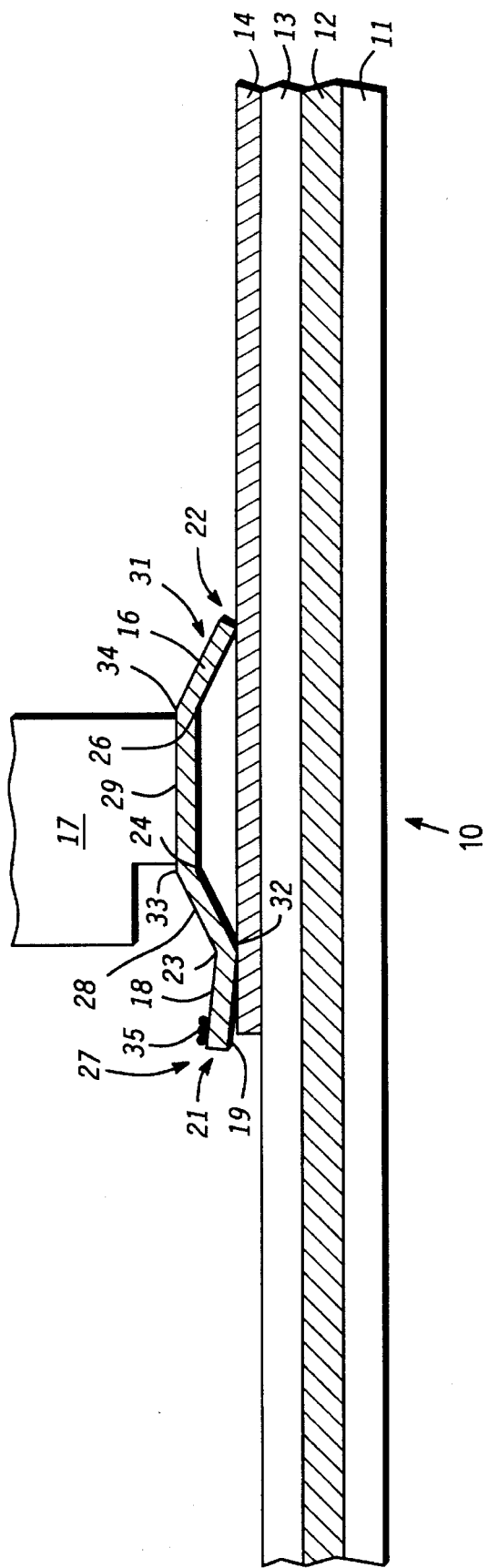
FIG. 1 illustrates a cross-sectional view of a cantilever spring in accordance with a first embodiment of the present invention.

FIG. 1 illustrates a cross-sectional view of a cantilever spring in accordance with a first embodiment of the present invention. More particularly, FIG. 1 shows a portion of a printed circuit board 10 comprising a conductive layer 12 sandwiched between two layers of dielectric material 11 and 13. Layer of dielectric material 13 has a conductive trace 14 disposed thereon. Preferably, conductive layer 12 is a ground plane comprising, for example, a layer of copper. Further, conductive trace 14 serves as a transmission line. Those skilled in the art will recognize transmission line 14 as a microstrip transmission line. Printed circuit boards, such as board 10, having transmission lines are well known to those skilled in the art. Printed circuit board 10 is mated with a test fixture (not shown) for testing semiconductor devices.

FIG. 1 further illustrates a cantilever spring 16 mounted to a portion of a base or socket 17. Socket 17 is positioned so that portions of cantilever spring 16 temporarily contact transmission line 14. In a preferred embodiment, cantilever spring 16 is a unitary structure having major surfaces 18 and 19, ends 21 and 22, and bends 23, 24, and 26. Bends 23, 24, and 26 divide cantilever spring 16 into four subsections 27, 28, 29, and 31. More particularly, bend 23 has an apex 32 and divides cantilever spring 16 into first and second subsections 27 and 28, respectively, wherein subsection 27 includes end 21. Bend 24 has an apex 33 and is between second subsection 28 and third subsection 29. Bend 26 has an apex 34 and is between third and fourth subsections 29 and 31, respectively, wherein fourth subsection 31 has an end 22. Optionally, subsection 27 is coated with a conductive abrasive material 35 such as, for example, conductive plated diamond dust to facilitate scrubbing as described with reference to FIGS. 2 and 3. By way of example, conductive plated diamond dust 35 is diamond dust plated with nickel.

Bend 23 bows in a direction away from transmission line 14, forming an obtuse angle between first and second subsections 27 and 28, respectively. By way of example, the angle between subsections 27 and 28 is approximately 165 degrees. Bends 24 and 26, on the other hand, bend in a direction towards transmission line 14. In other words bend 23 bows in a direction opposite bends 24 and 26. Bend 24 forms an obtuse angle between second and third subsections 28 and 29, respectively, whereas bend 26 forms an obtuse angle between third and fourth subsections 29 and 31, respectively. By way of example, the angles between subsections 28 and 29 and between subsections 29 and 31 are approximately 165 degrees. It shall be understood that the values of the angles between subsections 27 and 28, between subsections 28 and 29, and between subsections 29 and 31 are merely given for illustrative purposes and are not limitations of the present invention. Apex 32 and end 22 serve as contact or pressure points that initially contact transmission line 14. In FIG. 1, pressure points 32 and 22 are shown as resting on transmission line 14. Subsection 29 is coupled to a portion of socket 17 and is referred to as a contact region or a pressure point.

Figure 2:
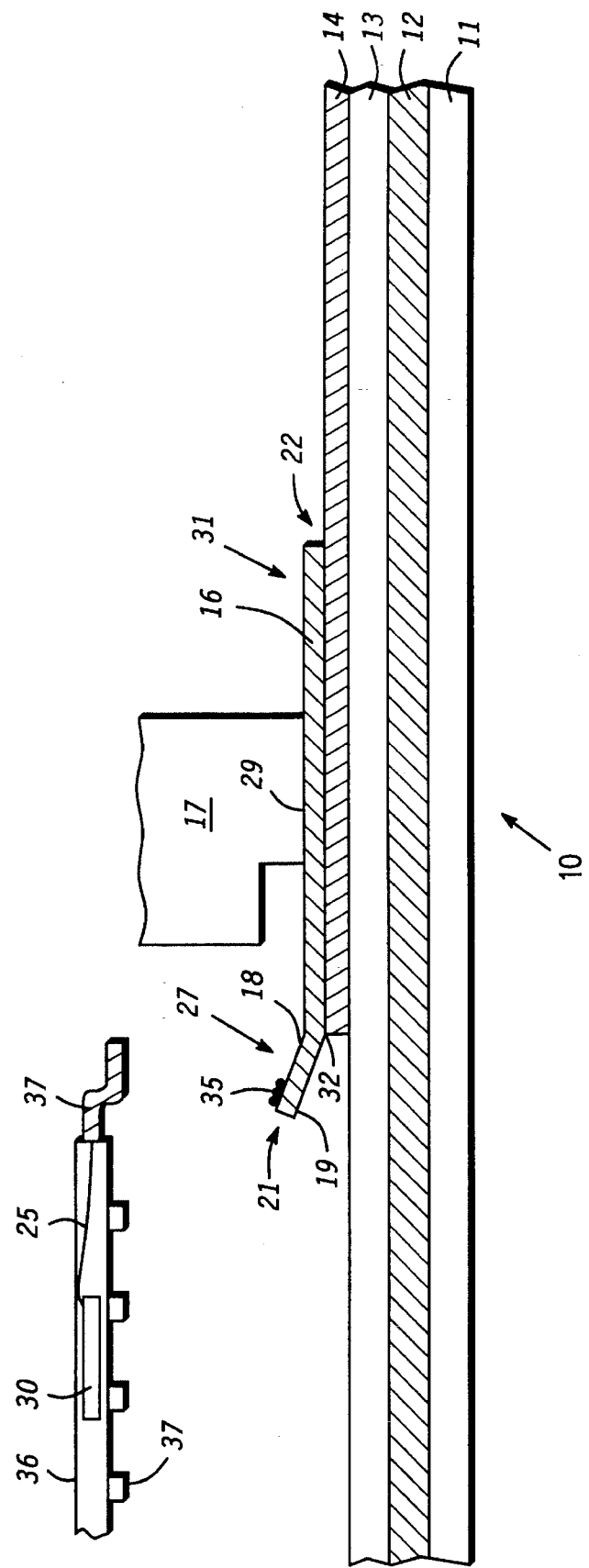
FIG. 2 illustrates a cross-sectional view of the cantilever spring of FIG. 1 in contact with a transmission line in accordance with a coupling embodiment of the present invention.

FIG. 2 illustrates a cross-sectional view of the cantilever spring of FIG. 1 in contact with a transmission line in accordance with a coupling embodiment of the present invention. It shall be understood that the same reference numerals are used in the figures to denote the same elements. A force or pressure is applied to socket 17 which in turn applies a force on subsection 29 and moves pressure point 29 towards transmission line 14. As subsection 29 moves towards transmission line 14, the angles of bends 24 and 26 increase, and pressure points 32 and 22 move in opposite directions along transmission line 14. Movement of pressure points 32 and 22 wipes or scrubs a surface of transmission line 14. As subsection 29 is pushed towards transmission line 14, a larger portion of surface 19 of subsection 31 contacts transmission line 14. Further end 21 moves in a direction away from transmission line 14.

Preferably, subsection 29 is pressed against transmission line 14 such that the angles between subsections 28 and 31, and subsection 29 is approximately 180 degrees. Thus, surface 19 of subsections 28, 29, and 31 of cantilever spring 16 is flush with transmission line 14. In accordance with a preferred embodiment, pressure point 32 is adjacent an end of transmission line 14 when subsection 29 is flush with transmission line 14. Thus, subsection 27 serves as a resilient contact region which extends from pressure point 32. Although not shown, it is preferable that cantilever spring 16 have a width as necessary to maintain the characteristic impedance of transmission line 14.

FIG. 2 further illustrates a cross-sectional view of a semiconductor device package 36 from which a plurality of leads 37 extend. Semiconductor device package 36 contains a semiconductor device 30 having contact pads coupled to leads 37 by interconnects 25. Preferably, each of the plurality of leads 37 mates with a corresponding transmission line 14, thereby coupling semiconductor device package 36 with a portion of transmission line 14. It shall be understood that only a single transmission line has been illustrated for the sake of simplifying FIGS. 1 and 2 as well as FIGS. 3 and 4. Although desirable, the plurality of leads 37 are typically not co-planar. One advantage of the present invention is that applying pressure to subsection 29, extends subsection 27 towards leads 37. Thus, when packaged semiconductor device 36 is mounted in socket 17 each of the plurality of leads 37 contacts a corresponding transmission line 14.

Figure 3:
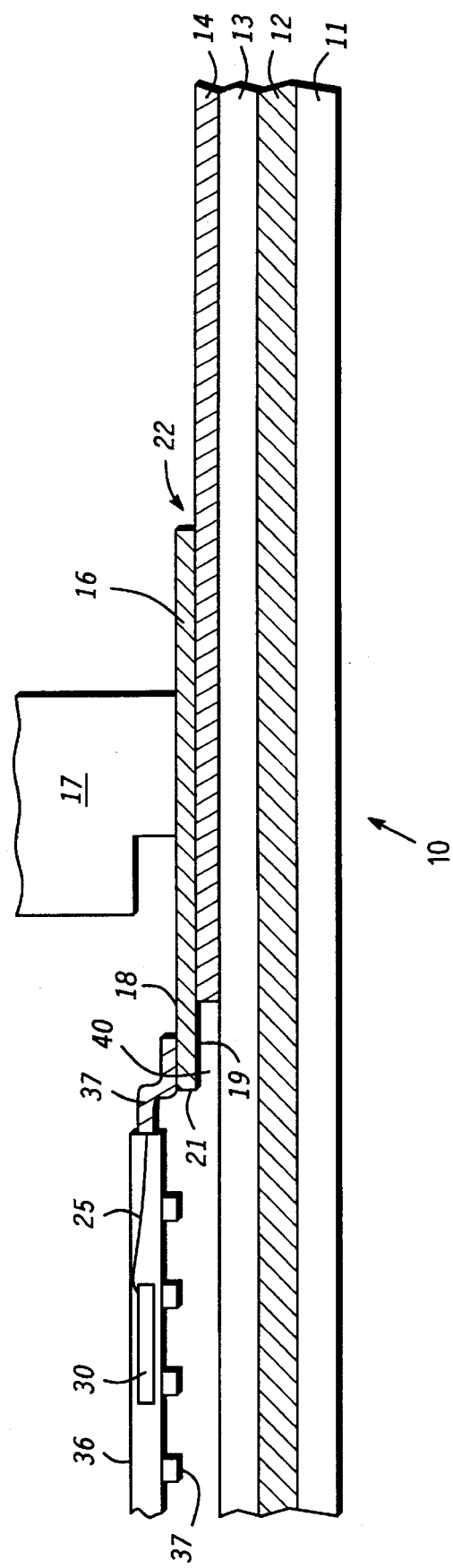
FIG. 3 illustrates a cross-sectional view of a packaged semiconductor device coupled to the transmission line in accordance with the coupling embodiment of the present invention.

FIG. 3 illustrates a cross-sectional view of semiconductor package 36 coupled to transmission line 14 in accordance with the coupling embodiment of the present invention. What is shown in FIG. 3 is a portion of semiconductor device package 36 positioned within a portion of a socket 17 for testing semiconductor device 30. Semiconductor device package 36 is positioned within socket 17 such that lead 37 contacts subsection 27 of cantilever spring 16. Preferably, major surface 18 of subsection 27 is coated with conductive plated diamond dust 35 (see FIG. 2) to scrub lead 37 as semiconductor package 36 is properly positioned within socket 17, thereby forming a low resistance contact. Positioning of semiconductor packages within sockets is well known by those skilled in the art. Preferably, the angle between subsections 27 and 28 is approximately 180 degrees when semiconductor package 36 is properly positioned within socket 17. It should be noted that if it is desirable to obtain the highest bandwidth, major surface 18 may be increased in width to compensate for an extra air dielectric 40 between subsection 27 and layer of dielectric material 13, thereby providing a constant controlled impedance from a tester (not shown) to semiconductor lead 37.

After testing semiconductor die 30, semiconductor package 36 is removed from socket 17. Next, either another semiconductor package 36 is tested or socket 17 and cantilever spring 16 are removed from transmission line 14. Cantilever spring 16 returns to the substantially the same configuration that it had before contacting transmission line 14.

Figure 4:
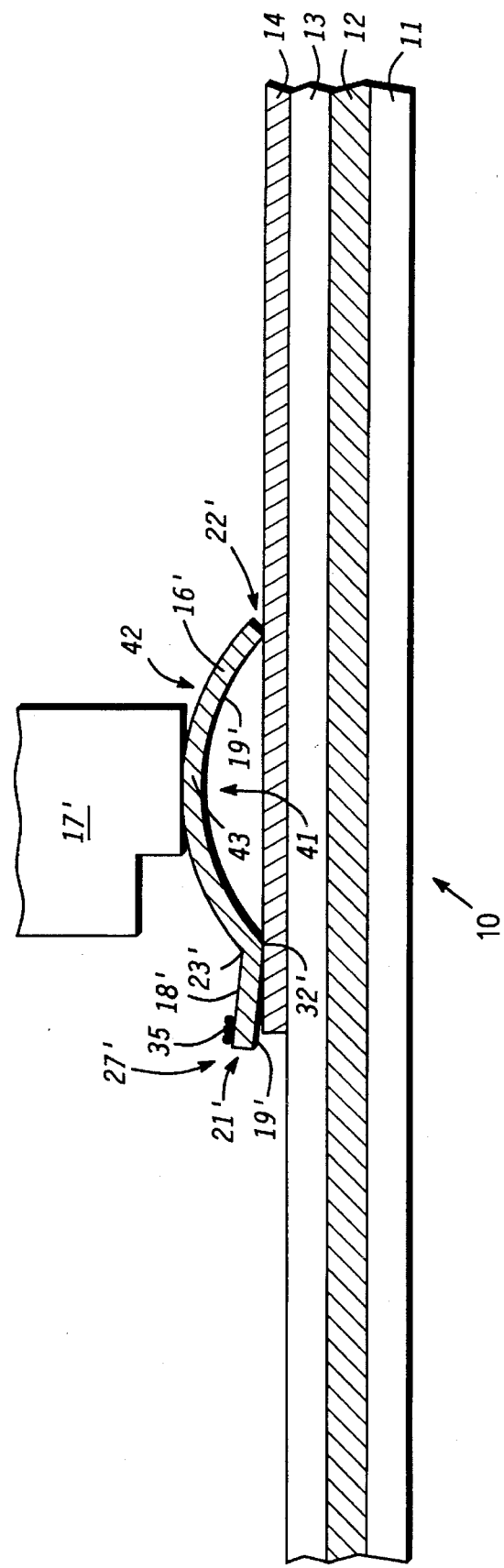
FIG. 4 illustrates a cross-sectional view of a cantilever spring in accordance with a second embodiment of the present invention.

FIG. 4 illustrates a cross-sectional view of a cantilever spring 16' mounted to a portion of a base or socket 17' in accordance with a second embodiment of the present invention. Similar to socket 17, socket 17' is positioned so that portions of cantilever spring 16' are resting on transmission line 14 of printed circuit board 10. In the second embodiment, cantilever spring 16' is a unitary structure having major surfaces 18' and 19', ends 21' and 22', and bends 23' and 41. Bend 23' has an apex 32' that serves as a first pressure point and divides cantilever spring 16' into two subsections. Apex 32' points in a direction towards transmission line 14. A first subsection 27' serves as a resilient contact region and extends from first pressure point 32' to end 21'. A second subsection 42 is comprised of an arcuate bend 41 which extends from pressure point 32' to an end 22'. Second subsection 42 has an apex 43 pointing in a direction opposite apex 32'. End 22' serves as a second pressure point and apex 43 serves as a third pressure point. Optionally, major surface 18' of subsection 27' is coated with a conductive plated diamond dust 35 to facilitate scrubbing in a manner analogous to that described with reference to FIGS. 2 and 3.

Bend 23' bows in a direction away from transmission line 14 and has an obtuse angle. By way of example, bend 23' has an angle of approximately 165 degrees. Arcuate bend 41, on the other hand, bends in a direction towards transmission line 14. In other words bend 23' bows in a direction opposite arcuate bend 41. Apex 32' and end 22' serve as contact or pressure points that initially contact transmission line 14., In FIG. 4, pressure points 32' and 22' are shown as resting on transmission line 14. Apex 43 is coupled to a portion of socket 17' and is referred to as a contact region or a pressure point.

A force or pressure is applied to socket 17' which in turn applies a force on pressure point 43, thereby moving pressure point 43 towards transmission line 14. As pressure point 43 moves towards transmission line 14, the angles of bends 23' and 41 increase, and pressure points 32' and 22' move in opposite directions along transmission line 14. Movement of pressure points 32' and 22' wipes or scrubs a surface of transmission line 14. Further, end 21' moves in a direction away from transmission line 14.

Preferably, major surface 19' of arcuate bend 41 is pressed against transmission line 14 such that the angle of arcuate bend 41 is approximately 180 degrees. Thus, surface 19' of arcuate bend 41 is flush with transmission line 14. In accordance with a preferred embodiment, pressure point 32' is adjacent an end of transmission line 14 when surface 19' is flush with transmission line 14. Thus, subsection 27' serves as a resilient contact region which extends from pressure point 32'. Although not shown, it is preferable that cantilever spring 16' have a width as necessary to maintain the characteristic impedance of transmission line 14.

It shall be understood that the description of the mating of a lead 37 (FIG. 3) to cantilever spring 16 also applies to mating leads 37 to cantilever spring 16'. Accordingly, the portions of the cantilever spring 16'. and socket 17' of FIG. 4 that correspond to spring 16 and socket 17 in FIGS. 1–3 are provided with the same reference numerals, wherein a "prime" has been attached to the reference numerals of FIG. 4. Thus, the description of mating the semiconductor package 36 to the leads 37 with reference to FIG. 3 applies to the similar elements (i.e., those with a "prime" notation) illustrated in FIG. 4.

Figure 5:
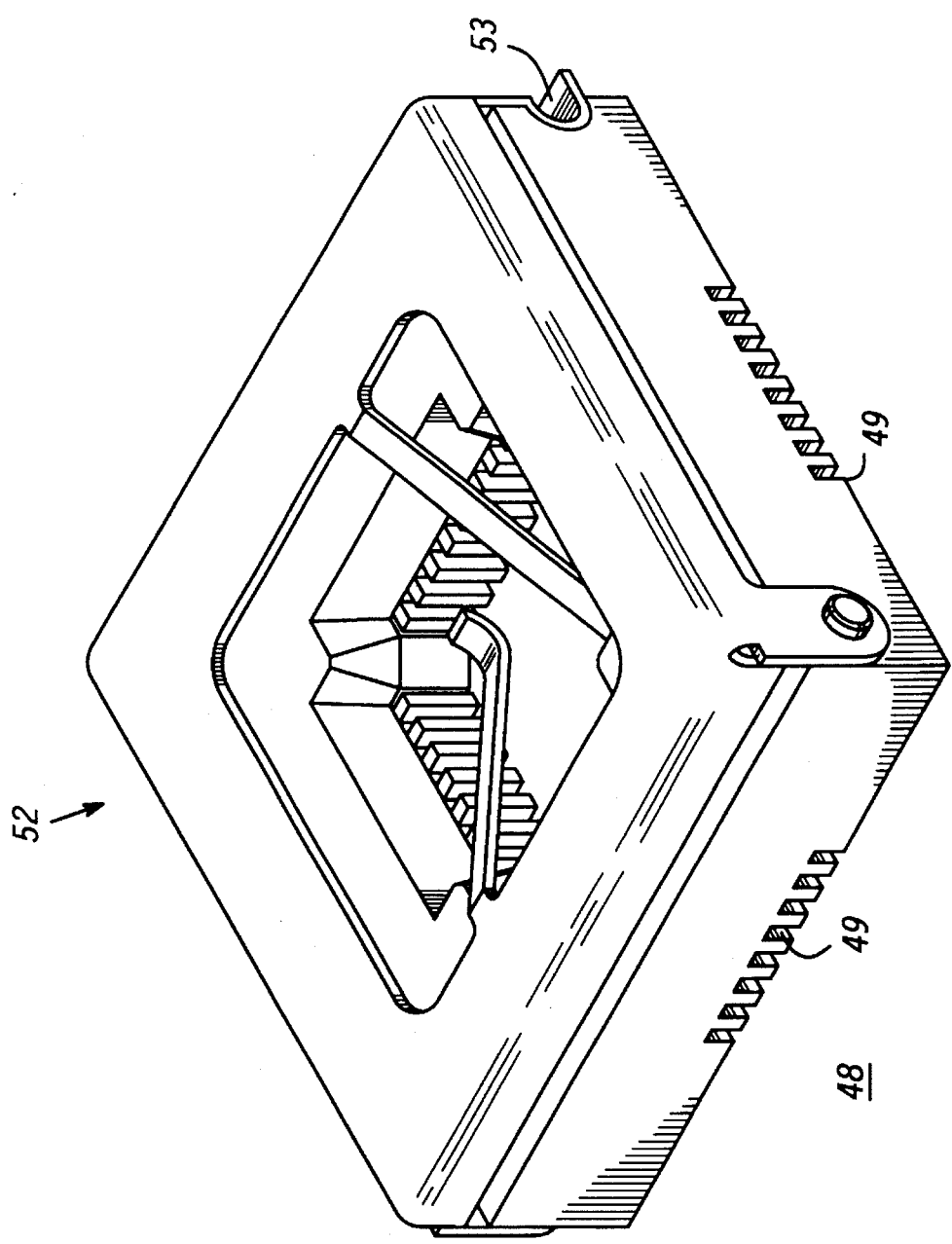
FIG. 5 illustrates an isometric view of a socket for mating with a cantilever spring in accordance with an embodiment of the present invention.

FIG. 5 illustrates an isometric view of a socket for mating with cantilever springs in accordance with the embodiments of the present invention. In the embodiment shown in FIG. 5, socket 48 is a unitary molded plastic contact carrier configured for a 32 lead semiconductor device. It should be noted that socket 48 is similar to sockets 17 and 17'. Socket 48 has a plurality of slots 49 for mating with cantilever springs 16 and 16' (FIGS. 2 and 4, respectively). It should be understood that the number of cantilever springs 16 and 16' with which socket 48 may be mated is not a limitation of the present invention. In other words, the sockets may be configured to mate with more than 32 cantilever springs 16 and 16' or less than 32 cantilever springs 16 and 16'. Socket 48 includes mounting screws (not shown) for mounting socket 48 to printed circuit board 10 (FIG. 1).

After socket 48 has been mounted to printed circuit board 10, semiconductor package 36 (FIG. 1) is inserted into socket 48 in a direction of arrow 52. Each lead 37 is aligned to a respective slot of the plurality of slots and contacts a respective cantilever spring 16. Semiconductor package 36 is held in position in socket 48 by a retaining lid 50 having a latch 53. Once semiconductor package 36 is in position, it is tested.

By now it should be appreciated that a cantilever spring and a method of testing a packaged semiconductor device using the cantilever spring has been provided. The method and cantilever spring of the present invention permit testing packaged semiconductor devices wherein the electrical interconnect from the test system to the semiconductor lead being tested is a controlled impedance transmission line. Further, the compliant cantilever springs of the present invention overcome poor coupling or the lack of an adequate coupling between the leads of the semiconductor package and a printed circuit board due to non-coplanar semiconductor package leads. Other advantages of the present invention include easy replacement of cantilever springs after they have become worn, scrubbing of the semiconductor package leads to provide a low impedance contact, and a short path to ground or power pins by including a via (not shown) through the printed circuit board at a location of bend 32.

It should be understood that for test systems that do not require ultra high bandwidth, the socket can be made with a small amount of socket material (e.g. mold compound) below portion 29 of the contact to hold the contact in place. This socket material provides two signal paths between bends 32 and end 22, however, bandwidths up to approximately 5 gigahertz are possible even with the two signal paths.

We claim:

1. A method for coupling a lead from a semiconductor device with a transmission line for testing the semiconductor device, comprising the steps of:

providing a cantilever spring, wherein the cantilever spring is a unitary structure having first and second major surfaces and a plurality of bends, a first bend bowing in a first direction and forming an apex which serves as a first contact point, and a first end of the cantilever spring serving as a second contact point;

coupling the first and second contact points with portions of the transmission line;

moving a second end of the cantilever spring in a direction away from the transmission line; and coupling the lead from the semiconductor device with a portion of the first major surface adjacent the second end.

2. The method of claim 1, further comprising the steps of:

providing the cantilever spring having a second bend, the second bend being arcuate and having an apex pointing in a direction opposite the apex of the first bend; and pressing the second bend in a direction towards the transmission line.

3. The method of claim 2, wherein the step of pressing the second bend includes contacting the transmission line with a portion of the second major surface between the first contact point and the second contact point, wherein the second bend is straightened.

4. The method of claim 1, wherein the steps of providing a cantilever spring and moving a second end of the cantilever spring further comprise:

providing the cantilever spring as a compound cantilever spring comprising second and third bends, wherein the second and third bends bow in a direction opposite the first direction, and a portion of the cantilever spring between the second and third bends serves as a contact region; and moving the second end of the cantilever spring by pressing the contact region towards the transmission line.

5. The method of claim 4, further including straightening the second and third bends by pressing the contact region against the transmission line, wherein a portion of the second major surface between the first and second contact points is flush against the transmission line.

6. The method of claim 4, wherein angles of the first, second, and third bends are obtuse angles.

7. The method of claim 1, further including scrubbing portions of the transmission line with the first and second contact points.

8. The method of claim 1, wherein the step of coupling the lead from the semiconductor device further comprises moving the second end of the cantilever spring to make an angle of approximately 180 degrees.

9. The method of claim 1, wherein the step of coupling the lead from the semiconductor device further includes testing the semiconductor device.

10. A method for coupling a semiconductor device to an electrical interconnect, comprising the steps of:

providing a cantilever spring having at least three pressure points, wherein a second pressure point is between a first pressure point and a third pressure point, and a resilient contact region extends from the first pressure point;

contacting a first portion of the electrical interconnect with the first pressure point and a second portion of the electrical interconnect with the third pressure point;

moving the resilient contact region in a direction away from the electrical interconnect; and contacting the resilient contact region with a semiconductor device lead.

11. The method of claim 10, wherein the step of moving the resilient contact region includes moving the second pressure point towards the electrical interconnect, scrubbing the first portion of the electrical interconnect with the first pressure point, and scrubbing the second portion of the electrical interconnect with the third pressure point.

12. The method of claim 10, wherein the step of providing a cantilever spring includes providing the cantilever spring having first, second, and third bends, the first bend separated from the second bend by the second pressure point, and the third bend coupled to the second bend, wherein an angle of the first, second, and third bends is an obtuse angle and the first and second bends bow in the same direction, and the third bend bows in a direction opposite from the first and second bends.

13. The method of claim 12, wherein the step of moving the resilient contact region includes pressing the cantilever spring against the electrical interconnect and making the angles of the first and second bends approximately 180 degrees.

14. The method of claim 10, wherein the step of contacting the resilient contact region includes moving the resilient contact region towards the electrical interconnect.

15. The method of claim 12, wherein the step of contacting the resilient contact region includes straightening the third bend to have an angle of substantially 180 degrees.

16. The method of claim 10, further including coating a portion of the resilient contact region with a conductive plated diamond dust.

17. A contact structure for coupling a semiconductor device to a transmission line, comprising:

a base; and a cantilever spring which mates with the base to form the contact structure, the cantilever spring being a unitary structure having first and second major surfaces and a plurality of bends, a first bend bowing in a first direction and forming an apex which serves as a first contact point, and a first end of the cantilever spring serving as a second contact point.

18. The contact structure of claim 17, wherein the cantilever spring further comprises a second bend, the second bend being arcuate and having an apex pointing in a direction opposite the apex of the first bend.

19. The contact structure of claim 17, wherein the cantilever spring further comprises second and third bends, wherein the second and third bends bow in a direction opposite the first direction, and a portion of the cantilever spring between the second and third bends serves as a contact region.

20. The contact structure of claim 17, wherein at least the first contact point is coated with a conductive plated diamond dust.

* * * * *